(12) United States Patent
Murakami

(10) Patent No.: US 8,575,726 B2
(45) Date of Patent: Nov. 5, 2013

(54) SEMICONDUCTOR DEVICE AND METHOD OF MANUFACTURING THE SAME

(75) Inventor: Yoshinori Murakami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 938 days.

(21) Appl. No.: 12/073,489

(22) Filed: Mar. 6, 2008

(65) Prior Publication Data
US 2008/0217744 A1    Sep. 11, 2008

(30) Foreign Application Priority Data

Mar. 8, 2007  (JP) ................................ 2007-058505
Oct. 26, 2007  (JP) ................................ 2007-278693

(51) Int. Cl.
  *H01L 23/58*    (2006.01)
(52) U.S. Cl.
  USPC .............................. 257/622; 257/103; 438/41
(58) Field of Classification Search
  USPC ........ 257/622, 623, E21, E23, 616, 627, 628; 438/118
  See application file for complete search history.

(56) References Cited

U.S. PATENT DOCUMENTS

| | | | |
|---|---|---|---|
| 6,100,199 A | 8/2000 | Joshi et al. | |
| 7,462,882 B2* | 12/2008 | Ueta et al. | 257/103 |
| 2003/0057568 A1* | 3/2003 | Miyazaki | 257/778 |
| 2005/0042787 A1* | 2/2005 | Ito et al. | 438/41 |
| 2005/0224252 A1* | 10/2005 | Mishiro | 174/256 |
| 2006/0022321 A1* | 2/2006 | Matsukawa et al. | 257/678 |
| 2007/0163992 A1* | 7/2007 | Michalk et al. | 216/41 |

FOREIGN PATENT DOCUMENTS

| | | |
|---|---|---|
| EP | 0 883 192 A2 | 12/1998 |
| JP | 4-312933 A | 11/1992 |
| JP | 8-70069 A | 3/1996 |
| JP | 2002-237454 * | 8/2002 |
| JP | 2005-120220 A | 5/2005 |
| JP | 2005-150220 A | 6/2005 |

* cited by examiner

Primary Examiner — Wai-Sing Louie
Assistant Examiner — Suian Tang
(74) Attorney, Agent, or Firm — Foley & Lardner LLP

(57) ABSTRACT

A semiconductor device includes: a semiconductor chip including: a first main face having an edge portion, a second main face locating the opposite side to the first main face, a crystalline defect region present within a region including at least the edge portion being adjacent to the first main face, the crystalline defect region being configured to have lower stress than the stress in the other semiconductor region for the same strain; and a metallic substrate to be bonded via a bonding member to the first main face of the semiconductor chip.

22 Claims, 13 Drawing Sheets

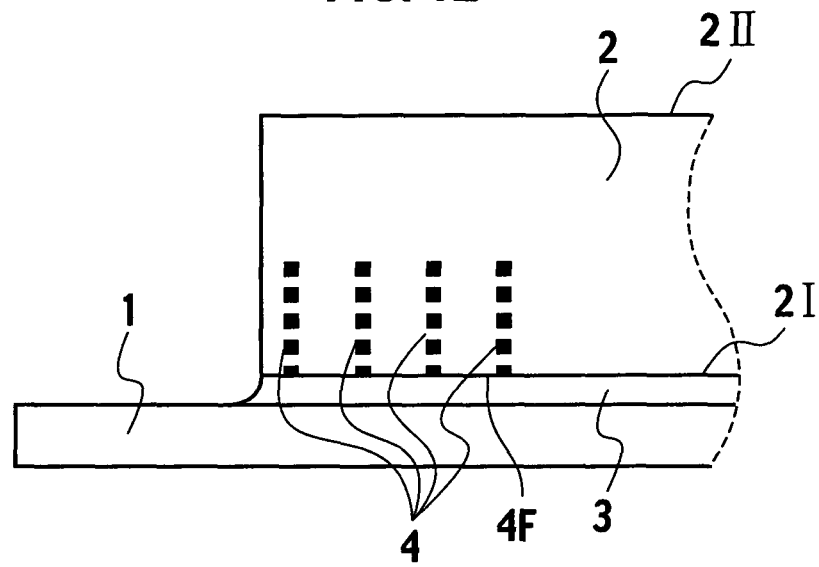
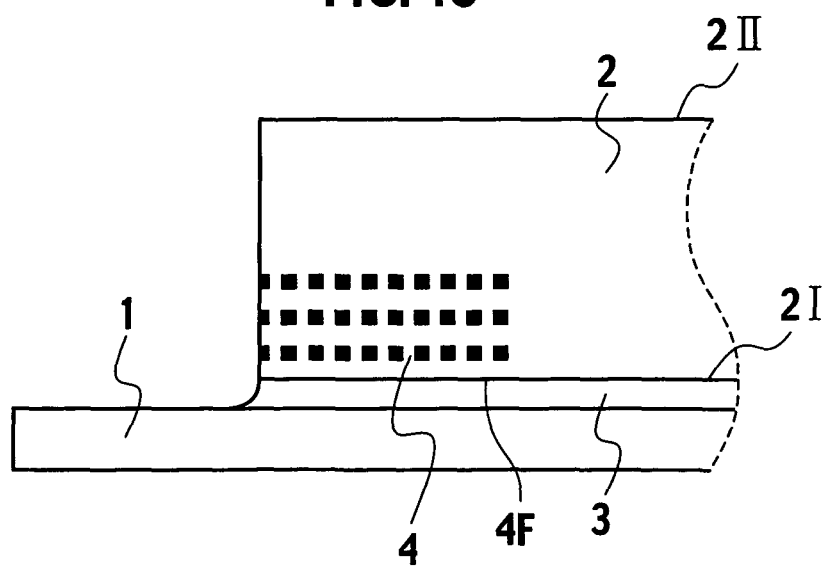

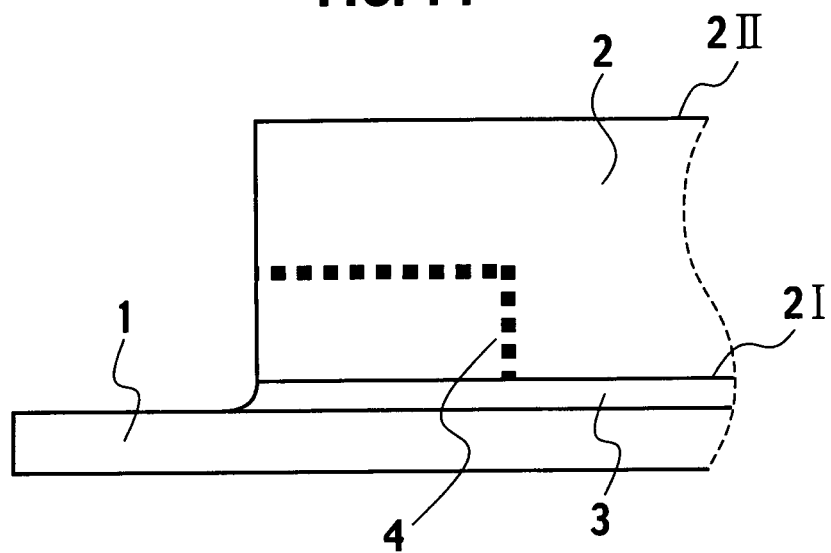
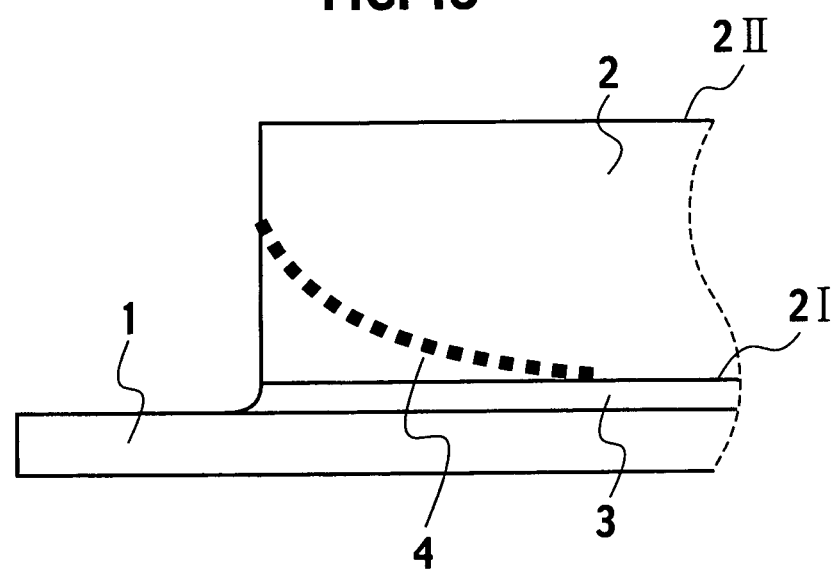

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device.

2. Description of the Related Art

Japanese Patent Laid-Open Publication No. Heisei 8 (1996)-070069 (=JP8070069) discloses a conventional semiconductor chip which is quadrilateral and has a backface bonded and fixed to a proper metallic substrate. Examples of materials used for the above bonding include solder (having a melting point of 400° C. or below), braze (having a melting point over 400° C.), metallic paste made from silver particles, a conductive adhesive, and the like.

Note that, since the semiconductor chip and the solder do not bond to each other directly, a metallic thin film is formed on the backface of the semiconductor chip, and the metallic thin film and the metallic substrate are bonded to each other by the adhesive.

SUMMARY OF THE INVENTION

It is an object of the present invention to provide a semiconductor device structure which can have longer lifetime with avoiding concentration of the stress in the bonded region between a semiconductor chip and a metallic substrate.

It is another object of the present invention to provide a method of manufacturing the above semiconductor device.

According to a first aspect of the present invention, there is provided a semiconductor device comprising: a semiconductor chip including: a first main face having an edge portion, a second main face locating the opposite side to the first main face, a crystalline defect region present within a region of the edge portion and adjacent to the first main face, the crystalline defect region being configured to have a lower stress than the stress in the other semiconductor region for the same strain; and a metallic substrate to be bonded via a bonding member to the first main face of the semiconductor chip.

According to a second aspect of the present invention, there is provided a method of manufacturing the semiconductor device, the method comprising: forming the crystalline defect region in a certain region of the semiconductor chip; forming a first metallic thin film on the first main face of the semiconductor chip which is in a state of being bonded to the metallic substrate; and bonding the metallic substrate to the first metallic thin film via the bonding member which is an adhesive.

Other objects and features of the present invention will become understood from the following description with reference to the accompanying drawings.

BRIEF DESCRIPTION OF THE DRAWINGS

FIG. 12 is a cross-sectional view taken along the face through the line segment XII-XII in FIG. 11 and cut perpendicularly to the paper.

FIG. 13 is a cross-sectional view for explaining an eighth example of the first embodiment of the present invention.

FIG. 14 is a cross-sectional view for explaining a ninth example of the first embodiment of the present invention.

FIG. 15 is a cross-sectional view for explaining a tenth example of the first embodiment of the present invention.

DESCRIPTION OF THE PREFERRED EMBODIMENTS

In the following, various embodiments of the present invention will be described in detail with reference to the accompanying drawings.

For ease of understanding, the following description will include various directional terms, such as left, right, upper, lower, forward, rearward and the like. However, such terms are to be understood with respect to only a drawing or drawings on which the corresponding part of element is shown.

First Embodiment

A first embodiment of the present invention is to be described below.

<Structure>

Figure 1:
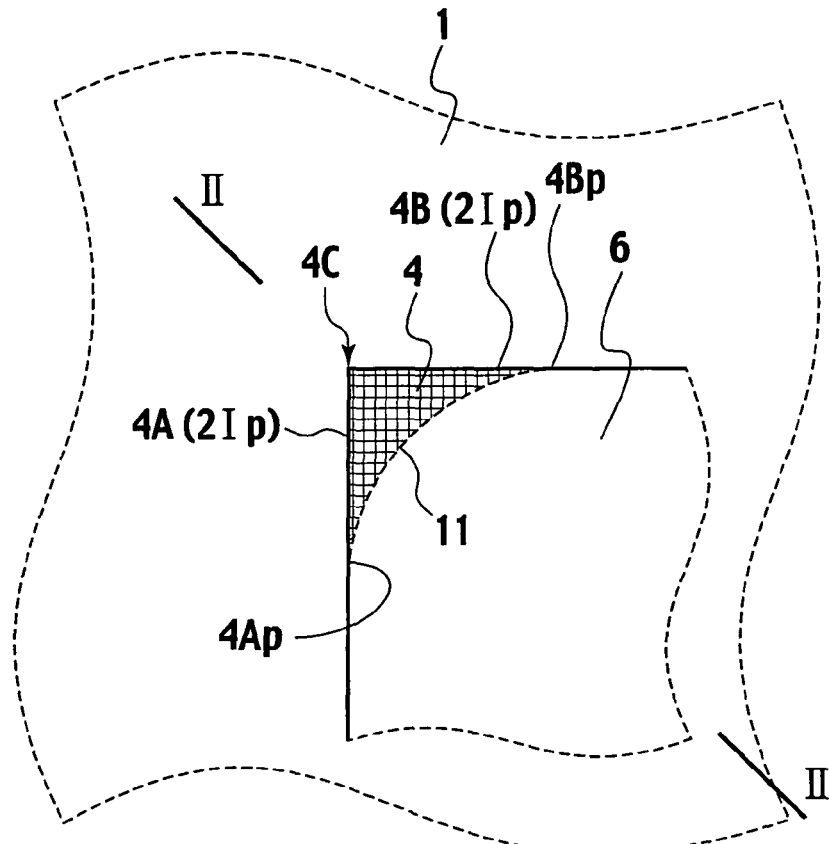
FIG. 1 is a transparent plan view for explaining a first embodiment of the present invention.

FIG. 1 is a transparent plan view of a semiconductor device 100 under the present invention viewed from the top, depicting only an area in the vicinity of one edge portion of a semiconductor chip 2.

Figure 2:
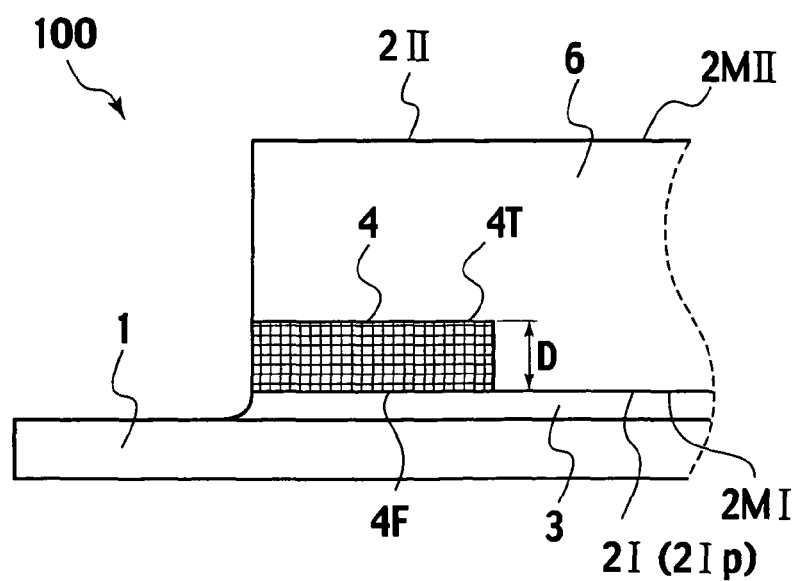
FIG. 2 is a cross-sectional view taken along the face through the line segment II-II in FIG. 1 and cut perpendicularly to the paper.

FIG. 2 is a cross-sectional view taken along the face through the line segment II-II in FIG. 1 and cut perpendicularly to the paper.

Figure 3:
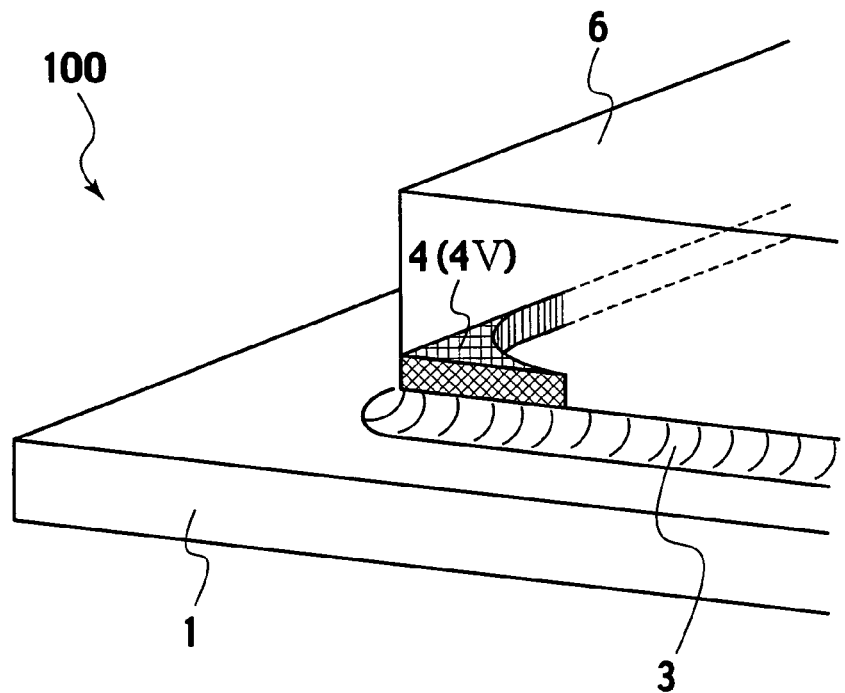
FIG. 3 is a transparent perspective view for explaining the first embodiment of the present invention.

FIG. 3 is a transparent perspective view of the area in the vicinity of the edge portion shown in FIG. 1.

The semiconductor chip 2 is bonded onto a flat plate-shaped metallic substrate 1 via an adhesive 3 serving as an adhesive member (=bonding member).

The semiconductor chip 2 is made of single crystal semiconductor material(s) such as SiC, Si, Ge, GaAs and GaN. An active region is formed on a surface 2II (otherwise referred to as "second main face 2II") side or formed from the surface 2II to a backface 2I (otherwise referred to as "first main face 2I"). The active region functioning such as transistor or diode (not shown in FIG. 1 to FIG. 3) is formed on the semiconductor chip 2. On the surface 2II of the semiconductor chip 2, there are one or more electrodes made from a second metallic thin film 2MII. The electrodes are respectively connected to corresponding external electrodes (not shown in FIG. 1 to FIG. 3). In the description of the first embodiment, the details of the electronic device is to be omitted.

Moreover, since the semiconductor chip 2 and the adhesive (bonding member) 3 do not bond to each other directly, a first metallic thin film 2MI is formed on the backface 2I (first main face 2I of semiconductor chip 2). The first metallic thin film 2MI enables the semiconductor chip 2 and the adhesive 3 to be bonded to each other.

For the adhesive 3, solder, braze, metallic paste made from silver particles, or a conductive adhesive may be used. The solder is used according to the first embodiment. Hereinafter, the adhesive 3 may be referred to as solder 3.

A crystalline defect region 4 is formed adjacent to the backface 2I at the edge portion of the semiconductor chip 2. Compared with a surrounding other semiconductor region 6, the crystalline defect region 4 is a region including more crystalline defects. Moreover, against the same amount of strain due to an external force, the strength of stress induced in the crystalline defect region 4 is smaller than that of stress induced in the other semiconductor region 6.

Otherwise, the crystalline defect region 4 is an aggregation of the above regions.

A method of forming the crystalline defect region 4 is to be described later.

Note that the crystalline defects existing in the crystalline defect region 4 may be present in the entire region drawn with hatching in the drawings (FIG. 1 to FIG. 3 and the like) or may be locally present in a particular location (to be described afterward) in the crystalline defect region 4.

In FIG. 1, FIG. 2 and FIG. 3, the crystalline defect region 4 has a certain volume 4V defined as a pillar-like region having the following structure:

1) in the plan view of FIG. 1, a first side line 4A and a second side line 4B sharing a point 4C, and a line 11 connecting to a first point 4Ap on the first side 4A and a second point 4Bp on the second side 4B forms as an outer periphery of a bottom side area 4F which is a part of the first main face 2I, and 2) in the side view of FIG. 2, a top side of area boundary 4T between the crystalline defect region 4 and the semiconductor region 6, which is apart from the bottom side area 4F with a distance D.

As described earlier, bonding of the semiconductor chip 2 with the metallic substrate 1 is completed after heating the semiconductor chip 2 and the metallic substrate 1 to the solder 3's melting temperature or higher, placing the thus molten solder 3 between the semiconductor chip 2 and the metallic substrate 1, and thereafter decreasing the entire temperature to solidify the solder 3.

The thermal expansion coefficients of the semiconductor chip 2 and the metallic substrate 1 are different from each other. Therefore, after the solder 3 is solidified, a stress is generated in a bonded region.

The stress is concentrated especially in the edge portion of the semiconductor chip 2. The smaller the curvature radius of the edge portion is, the larger the intensity of the stress becomes.

Throughout the description of the present invention, it is the semiconductor device 100's edge portion that is set forth in detail.

Figure 4:
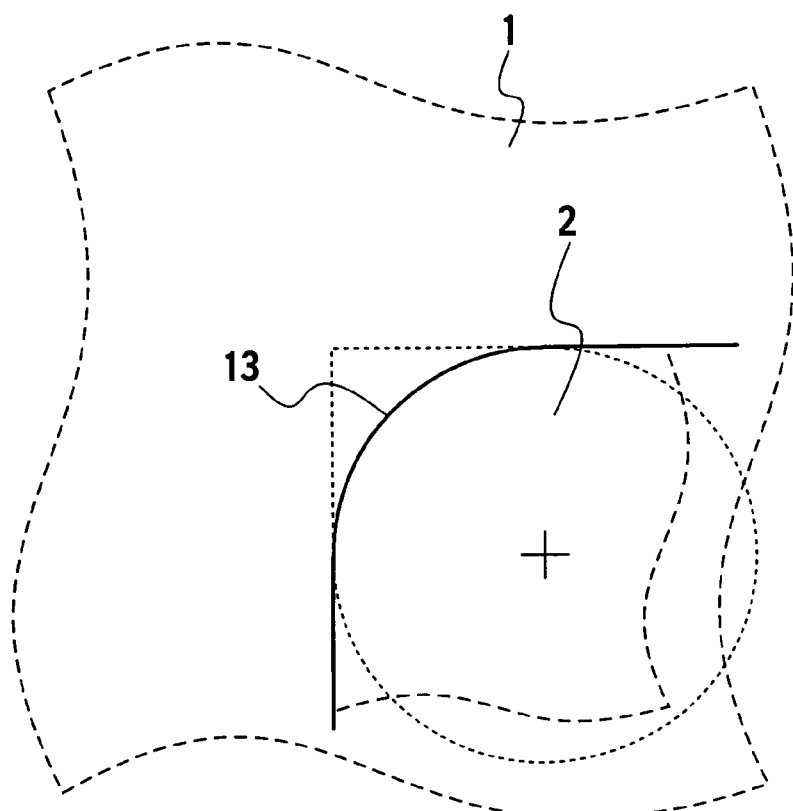
FIG. 4 is a plan view for explaining an ideal shape of an edge portion of a semiconductor chip to avoid stress concentration, according to a first example of the first embodiment of the present invention.

FIG. 4 is a plan view for explaining an ideal shape of the edge portion of the semiconductor chip 2 to avoid the concentration of the stress induced from above-mentioned difference of thermal expansion coefficient between the metallic substrate 1 and the semiconductor chip 2. It is known that when the edge portion of the semiconductor chip 2 is rounded to have a circular arc being fit to the circle 13 in FIG. 4, the stress concentration can be reduced considerably. In view of the current forming technology, however, it is highly difficult to realize such round edge shape.

Therefore, the crystalline defect region 4 is formed in the edge portion of the semiconductor chip 2. As is mentioned above, the difference of thermal expansion coefficients between the semiconductor chip 2 and the metallic substrate 1 causes a strain to the bonded portion especially to an edge portion of it. The crystalline defect region 4 can reduce the stress concentrated at the edge portion of the semiconductor chip 2.

The stress in the bonded portion becomes closer to the one caused by the rounded edge portion in FIG. 4, thus lowering a possibility of crack generation and decreasing degradation of heat-radiating performance.

Also, the lowered possibility of crack generation can bring about such an effect that the life of the bonded portion is elongated.

The present technology has controlled the probability of such inconvenient phenomena caused by the crack not to fall the device's life span below the demanded value by taking a countermeasure such that the solder 3's thickness thicken to reduce the strain of the solder 3 with same deformation. However, this measure causes another demerit, that is, increase of electric and thermal resistance in the bonded region. The present invention can act the same role with avoiding these fault.

In other words, the present invention capable of decreasing the adhesive (solder) 3's thickness can bring about such an effect that the electric resistance and heat resistance of the adhesive 3's layer can be decreased.

Note that a profile 4E (=the connecting line 11) of the crystalline defect region 4, which is a circular arc in FIG. 1 and FIG. 3, may have any shape as long as the profile 4E gentles the curvature of the edge portion. The profile 4E may be a curve tangent to each of the first and second sides 4A, 4B which share the point 4C. Otherwise, the profile 4E may be a part of a polygon.

Figure 5:
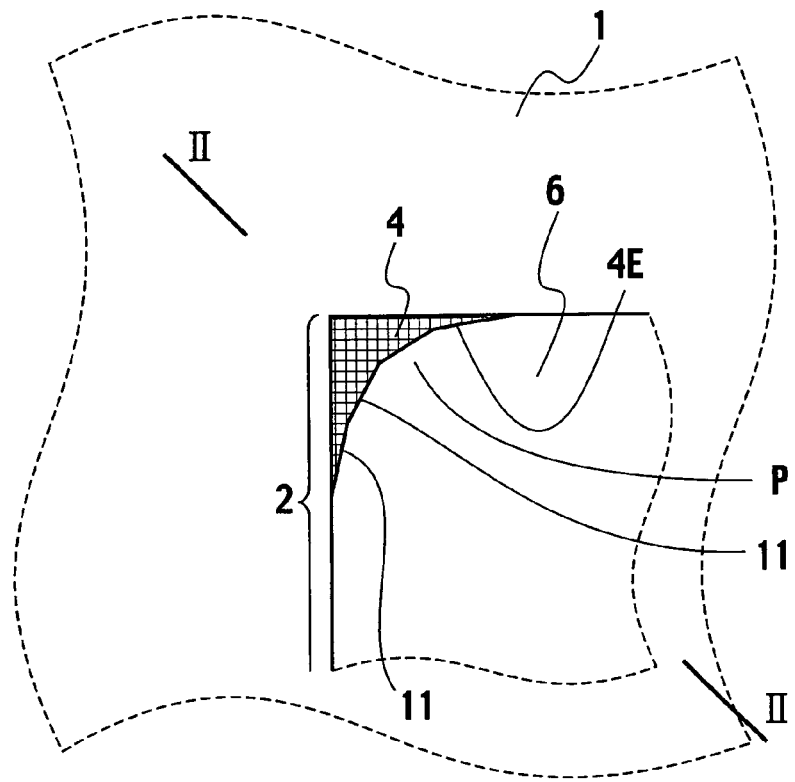
FIG. 5 is a transparent plan view for explaining a second example of the first embodiment of the present invention.

FIG. 5 is a transparent plan view for explaining a second example of the first embodiment of the present invention.

In FIG. 5, the profile 4E is a part of a polygon P.

Figure 6:
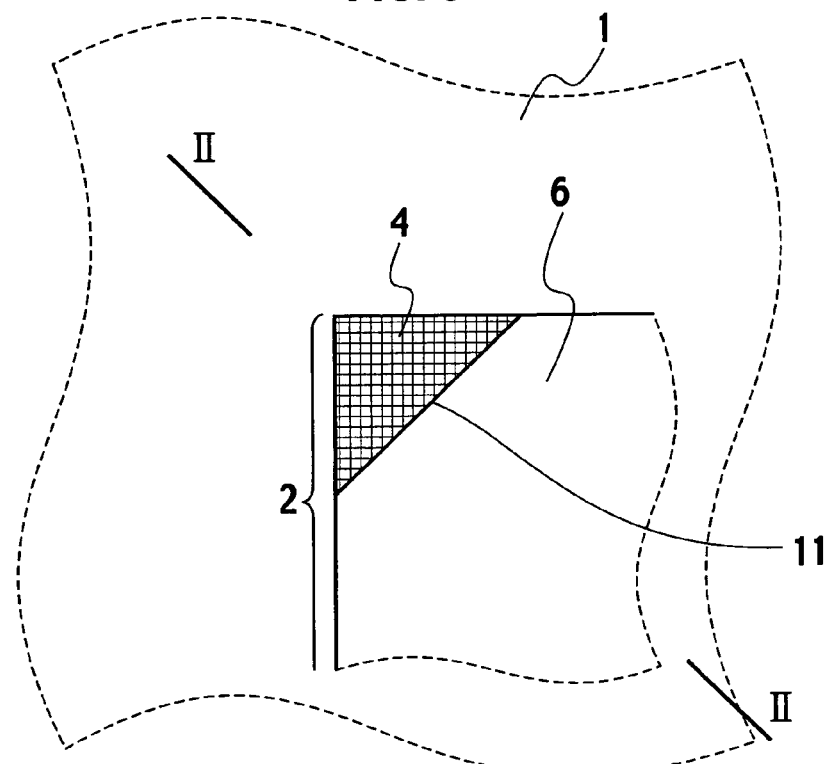
FIG. 6 is a transparent plan view for explaining a third example of the first embodiment of the present invention.

FIG. 6 is a transparent plan view for explaining a third example of the first embodiment of the present invention.

Using a triangle shape as shown in FIG. 6 instead of the circular arc 13 shown in FIG. 4 is effective to a certain degree. In this case, the connecting line 11 is a straight line for connecting the first side 4A and the second side 4B which share the point 4C.

Figure 7:
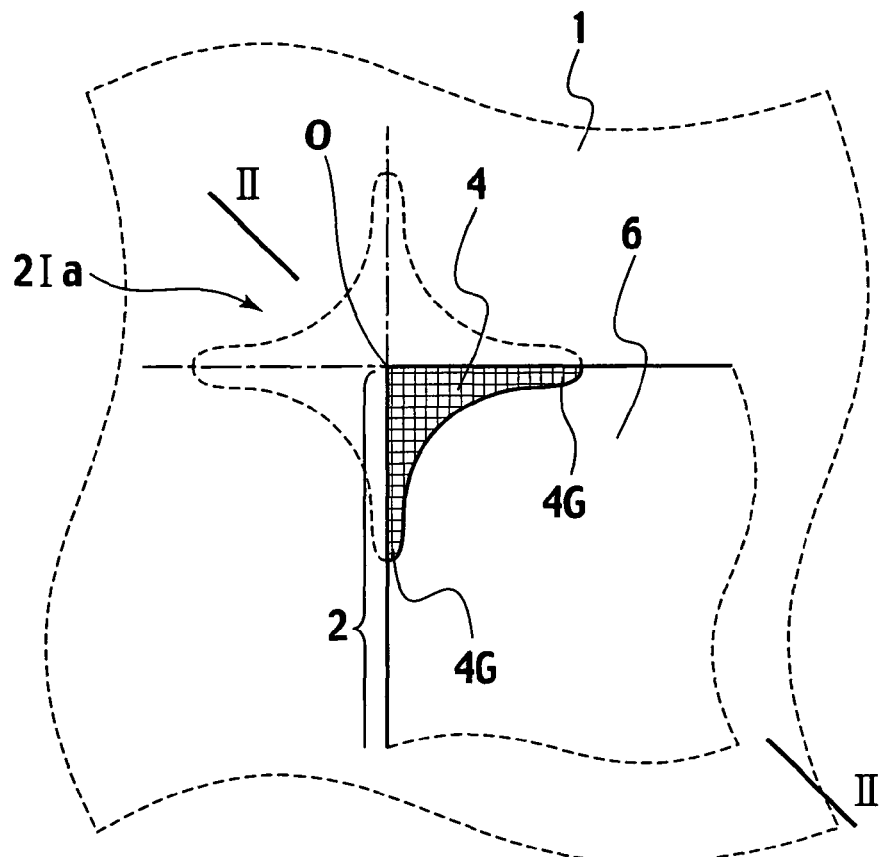
FIG. 7 is a transparent plan view for explaining a fourth example of the first embodiment of the present invention.

FIG. 7 is a transparent plan view for explaining a fourth example of the first embodiment of the present invention.

As shown in FIG. 7, the profile 4E may also have a shape like a part of number 10 in Japanese kanji character which looks like a cross shape "+" (hereinafter, referred to as a cross region 2Ia). In this case, the curvature is larger at positions farther from a center O (equivalent to the point 4C) and an edge portion 4G of the crystalline defect region 4 is also in curve.

The semiconductor chip 2 is cut out from a disc-like wafer. Forming the crystalline defect region 4 before cutting out the chip from the wafer is, as the case may be, more efficient. In such a case, a mark for cutting out the semiconductor chip 2 is generally made on a surface of the wafer, but the crystalline defect region 4 exists on a backface of the water. Hence, technically, some displacement must be allowed.

Forming the shape of the crystalline defect region 4 as shown in each of FIG. 1, FIG. 5 and FIG. 6 is of difficulty. Therefore, the shape shown in FIG. 7 is formed by rounding off the end portion 4G which is typically acute-angled. The shape in FIG. 7 can also bring about an effect that the displacement between the surface 2II and the backface 2I is allowed to a certain extent.

<Methods of Forming Crystalline Defect Region 4>

Next, first to third methods of forming the crystalline defect region 4 are described below.

—First Forming Method—

The first method uses a technology including the following operations for forming a region including a large amount of crystalline defects:

1) focusing, into the semiconductor chip 2, a laser beam having a wavelength to be absorbed by the semiconductor chip 2, 2) instantaneously heating dot-like regions within a region including the edge portion of the first main face 2I, and 3) instantaneously quenching the dot-like regions.

The above operations form a structure where the crack is generated only in the crystalline defect region 4 with a relatively small stress. As a result, the extension of cracks is limited within the profile 4E.

Note that dot-like crystalline defect regions 4 may be effectively distributed in various fashions within the region of the edge portion.

Figure 8:
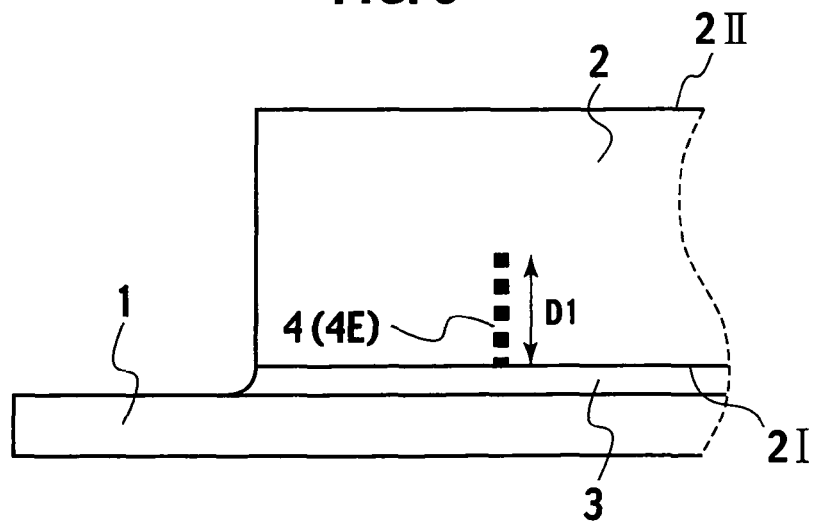
FIG. 8 is a cross-sectional view for explaining a fifth example of the first embodiment of the present invention, taken along the face through the line segment IIIV-IIIV in FIG. 9 and cut perpendicularly to the paper.
Figure 9:
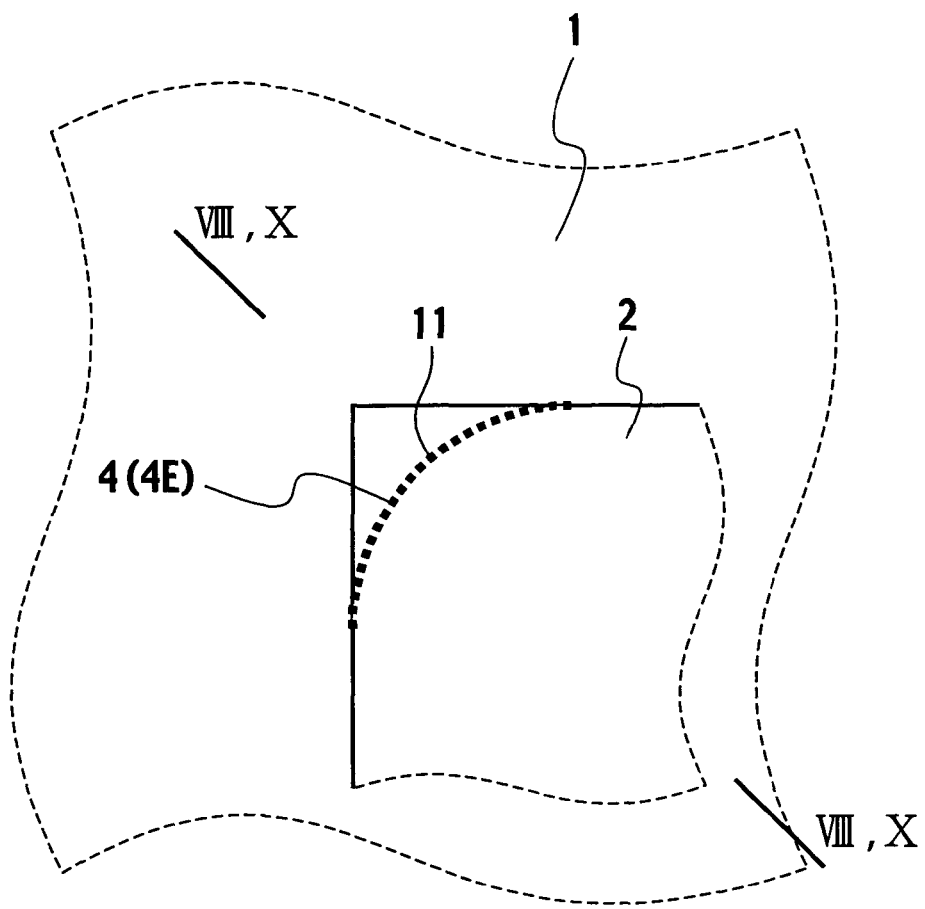
FIG. 9 is a transparent plan view showing FIG. 8 or FIG. 10 from the top.

FIG. 8 is a cross-sectional view for explaining a fifth example of the first embodiment of the present invention, taken along the face through the line segment IIIV-IIIV in FIG. 9 and cut perpendicularly to the paper.

As shown in FIG. 8, approximately the same effect may be obtained by introducing crystalline defects from the backface 2I of the semiconductor chip 2 to a certain depth D1 along the profile 4E. The thick dotted line in FIG. 8 represents the crystalline defect region 4 and is introduced as shown in FIG. 9 in the plan view.

Figure 10:
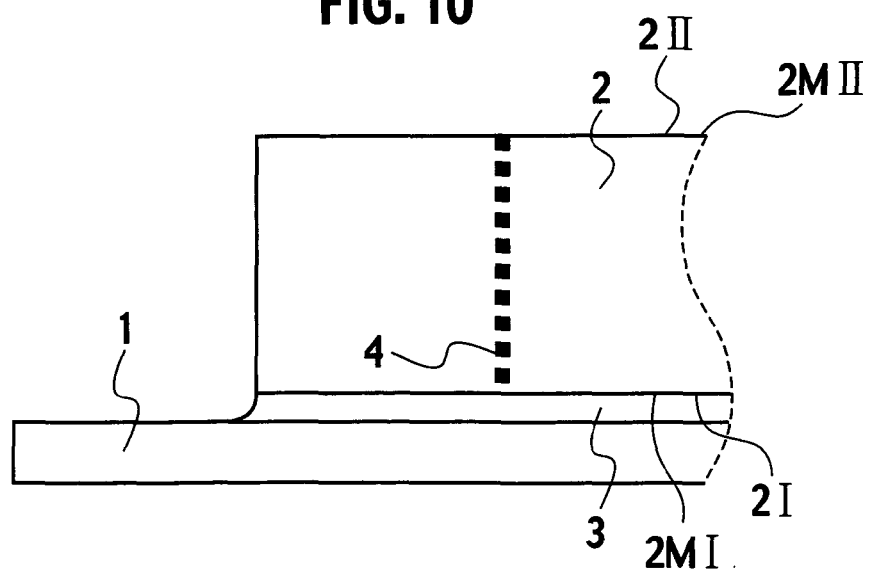
FIG. 10 is a cross-sectional view for explaining a sixth example of the first embodiment of the present invention, taken along the face through the line segment X-X in FIG. 9 and cut perpendicularly to the paper.

FIG. 10 is a cross-sectional view for explaining a sixth example of the first embodiment of the present invention, taken along the face through the line segment X-X in FIG. 9 and cut perpendicularly to the paper.

Alternatively, the crystalline defect regions 4 can be introduced to such an extent as to reach the surface 2II of the semiconductor chip 2 as shown in FIG. 10. In this case, although the edge portion may be separated due to extension of a crack, there will be no substantial problem since the semiconductor chip 2 is generally covered with some organic substance.

Figure 11:
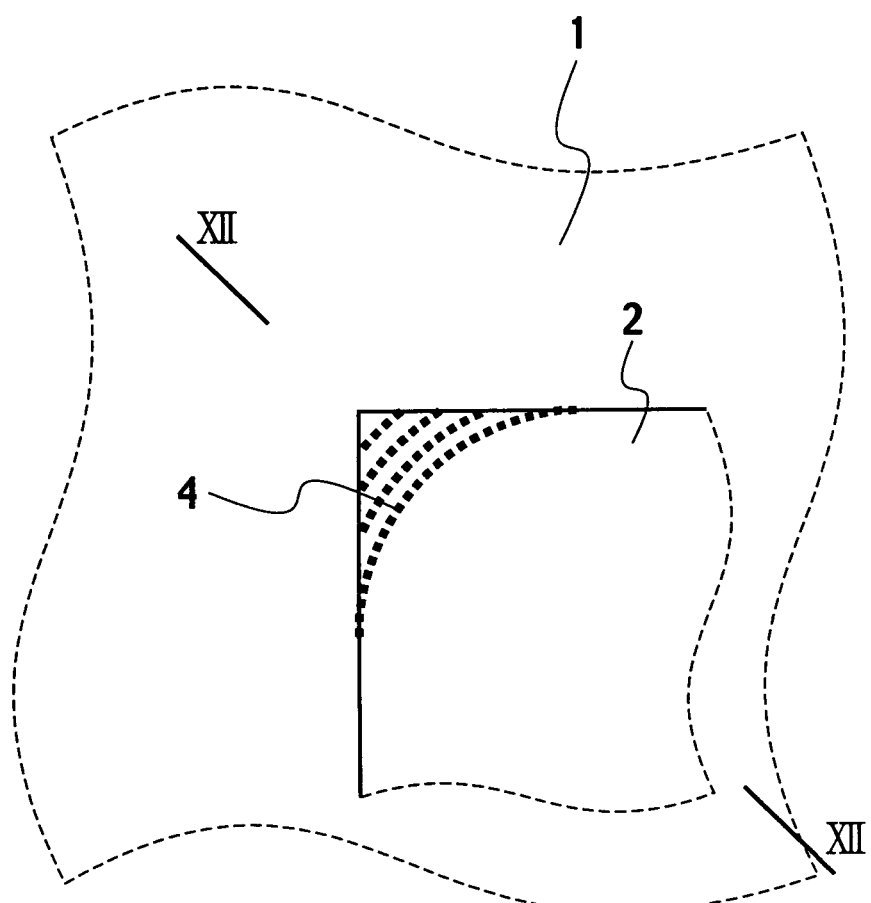
FIG. 11 is a transparent plan view for explaining a seventh example of the first embodiment of the present invention.

FIG. 11 is a transparent plan view for explaining a seventh example of the first embodiment of the present invention.

Alternatively, the crystalline defect region 4 may be introduced in a plurality of lines in ripple-like shape as shown in FIG. 11.

FIG. 12 is a cross-sectional view taken along the face through the line segment XII-XII in FIG. 11 and cut perpendicularly to the paper.

FIG. 13 is a cross-sectional view for explaining an eighth example of the first embodiment of the present invention.

As shown in FIG. 13, a plurality of crystalline defect regions 4 may be formed in parallel with the bottom face 4F (the first main face 2I). In this case, a corresponding plan view is FIG. 1.

FIG. 14 is a cross-sectional view for explaining a ninth example of the first embodiment of the present invention.

Alternatively, the crystalline defect regions 4 may be so configured as to have a shape in FIG. 14. FIG. 14 is a combination of FIG. 8 and FIG. 13. In this case too, the edge portion is separated when the crack extends, which is, however, not a substantial problem.

FIG. 15 is a cross-sectional view for explaining a tenth example of the first embodiment of the present invention.

In the first method using the technology for introducing the dot-like crystalline defect regions 4, the shape of the crystalline defect region 4 is formed arbitrarily.

Therefore, the shape of the region tangent to the bottom face 4F of the crystalline defect region 4 (the backface 2I of the semiconductor chip 2) may be, for example, like the one shown in FIG. 9, while the cross-sectional shape may be like the one shown in FIG. 15.

—Second Forming Method—

A second method of forming the crystalline defect region 4 introduces different types of materials.

For example, in a process before cutting out the semiconductor chip 2 from the wafer, the second method includes the following operations for forming the crystalline defect region 4:

1) forming a shallow groove in the backface of the wafer, as depicted by the cross region 2Ia drawn with the hatching in FIG. 7, 2) by means of a CVD (Chemical Vapor Deposition) or the like, depositing, in the shallow groove, different types of materials such as polycrystalline semiconductor, amorphous semiconductor, PSG (phosphosilicate glass) and the like, and 3) flattening the portion where the shallow groove is formed.

Any other materials may be used as long as such materials do not deform so much with some MPa. Specifically, the above materials are those capable of absorbing a possible strain caused by bending, plastic deforming or crack with a stress about 100 MPa.

—Third Forming Method—

Figure 16:
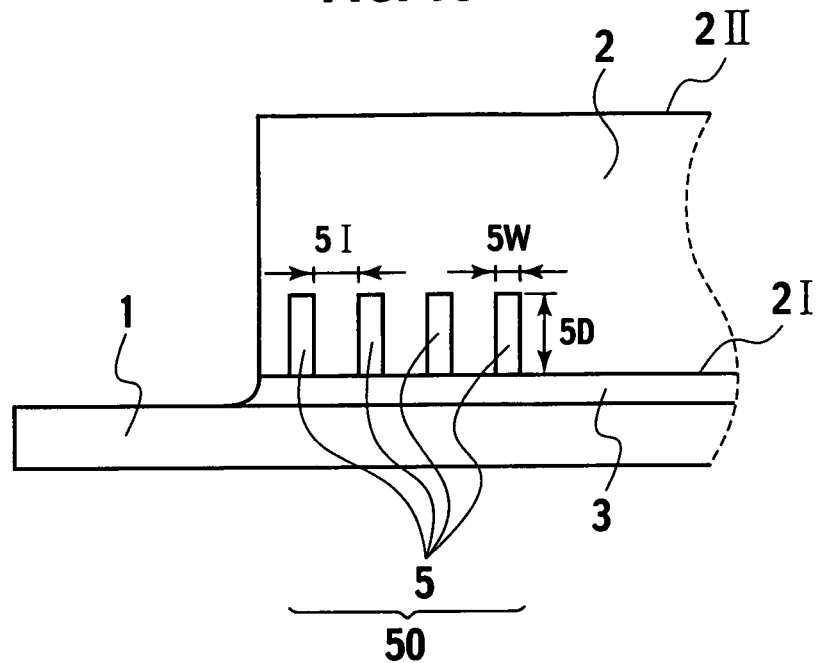
FIG. 16 is a cross-sectional view for explaining an eleventh example of the first embodiment of the present invention.

FIG. 16 is a cross-sectional view for explaining an eleventh example of the first embodiment of the present invention.

A third method of forming the crystalline defect region 4 forms a groove 5.

Following the plan view of FIG. 11, a plurality of grooves 5 each having a depth 5D equal to or larger than a width 5W are formed in the first main face 2I of the semiconductor region 2, as shown in FIG. 16.

Against the same strain due to an external force, a region 50 where the grooves 5 are formed generates a smaller stress than a region where the grooves 5 are not formed. Moreover, the region 50 has the same effect as that brought about by the crystalline defect region 4.

In other words, the region 50 where the grooves 5 are formed may be considered as a crystalline defect region which has an effect equivalent to that brought about by the crystalline defect region 4. In the region 50, a part of crystal is missing. In this case, it is preferable to set the depth 5D of each of the grooves 5 to equal to or larger than twice an interval 5I between ends of the grooves 5.

Figure 17:
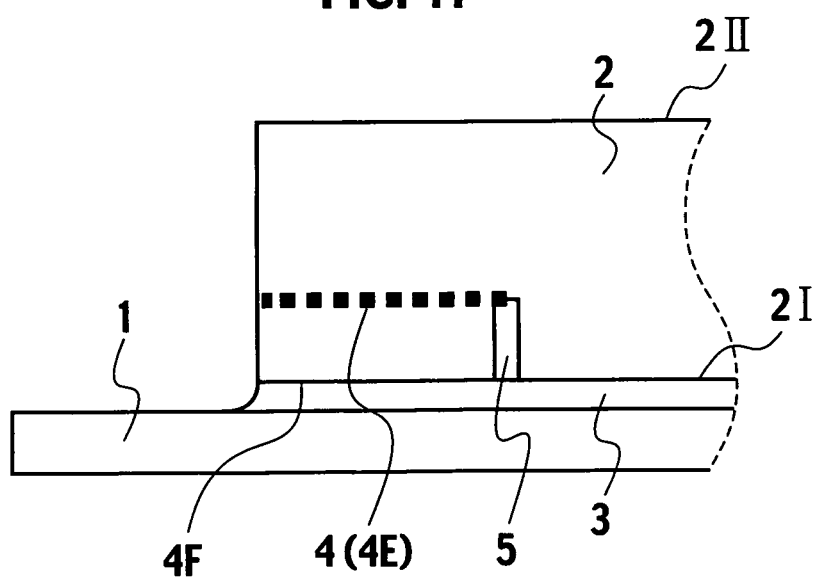
FIG. 17 is a cross-sectional view for explaining a twelfth example of the first embodiment of the present invention.

FIG. 17 is a cross-sectional view for explaining a twelfth example of the first embodiment of the present invention.

Moreover, as shown in FIG. 17, the grooves 5 may be arranged along the profile 4E of the crystalline defect region 4 and the crystalline defect regions 4 may be placed in parallel with the bottom face 4F (the first main face 2I) following FIG. 13.

In some processes for forming the grooves 5, a part of the first metallic thin film 2MI necessary for soldering (solder 3) is put in the grooves 5. In the above processes, however, whether the first metallic thin film 2MI is put in the grooves 5 or not does not influence the effect so much.

As described so far, according to the first embodiment, the metallic substrate 1 is bonded via the adhesive 3 to the backface 2I of the semiconductor chip 2 having the edge portion. The semiconductor chip 2 includes the crystalline defect region 4 which includes the edge portion of the backface 2I, and the other semiconductor region 6 other than the crystalline defect region 4.

Moreover, against the same amount of strain due to an external force, the strength of stress induced in the crystalline defect region 4 is smaller than that of stress induced in the other semiconductor region 6.

Therefore, the presence of the crystalline defect region 4 can reduce the stress concentration considerably. As far as a stress in the bonded portion is concerned, it is closer to a state where a rounded shape of the edge portion is realized, thus obtaining an effect that a possibility of crack generation is lowered and degradation of heat-radiating performance is deceased.

Furthermore, in the backface 2I of the semiconductor chip 2 within the region including the edge portion, forming the groove 5 having the depth 5D equal to or larger than the width 5W can bring about the same effects as above.

Also, the lowered possibility of crack generation can bring about such an effect that the life of the bonded portion is elongated.

The present technology has controlled the probability of such inconvenient phenomena caused by the crack not to fall the device's life span below the demanded value by taking a countermeasure such that the solder 3's thickness thicken to reduce the strain of the solder 3 with same deformation. However, this measure causes another demerit, that, is increase of electric and thermal resistance in the bonded region. The present invention can act the same role with avoiding these fault.

In other words, the present invention capable of decreasing the adhesive (solder) 3's thickness can bring about such an effect that the electric resistance and heat resistance of the adhesive 3's layer can be decreased.

Furthermore, since the crystalline defect region 4 is formed to include more crystalline defects than the other semiconductor region 6, the crystalline defect region 4 can be formed according to a normal semiconductor manufacturing method, and realized inexpensively. Moreover, forming the grooves 5 can be realized easily and inexpensively by using a normal lithography technology.

Second Embodiment

Next, a second embodiment of the present invention is to be described.

<Structure and Method>

Figure 18:
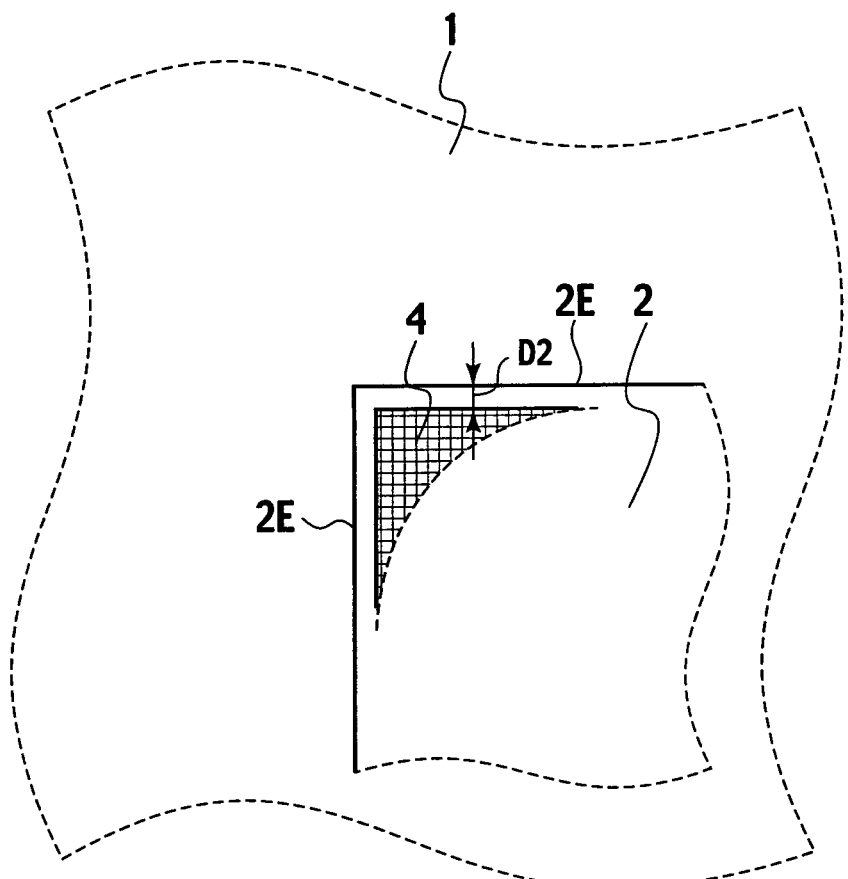
FIG. 18 is a view for explaining a second embodiment of the present invention.

FIG. 18 according to the second embodiment is a plan view based on FIG. 1 according to the first embodiment. As stated earlier, forming the crystalline defect region 4 before cutting out the semiconductor chip 2 from the wafer process is, as the case may be, more efficient. In such a case, in order to prevent the crystalline defect region 4, which is vulnerable to an external force, from being affected by the external force in the cutting-out process, the edge portion is formed slightly inside (for example, approximately 10 μm: defined as "certain distance D2") from an end 2E of the semiconductor chip 2 which is to be cut out. By forming the crystalline defect region 4 in the above configuration, deformation or loss of a part of the crystalline defect region 4 before exerting the original function thereof is avoided.

Note that the method of placing the certain distance D2 between the end 2E of the semiconductor chip 2 and the crystalline defect region 4 can be applied to all the first to twelfth examples according to the first embodiment.

As described above, according to the second embodiment, the crystalline defect region 4 is so formed as to be away from the end 2E of the semiconductor chip 2 by the certain distance D2. Therefore, in addition to the effects brought about according to the first embodiment, the second embodiment can bring about the following effect: Before the crystalline defect region 4 exerts its original function, deformation or loss of a part of the crystalline defect region 4 can be avoided.

<Methods of Manufacturing Semiconductor Device 100>

A method of manufacturing the semiconductor device 100 under the present invention has the following sequential operations:

1) a first operation of forming the crystalline defect region 4 in a certain region of the semiconductor chip 2, 2) a second operation of forming the first metallic thin film 2MI on the first main face 2I which is in a state before being bonded to the metallic substrate 1, and 3) a third operation of bonding the metallic substrate 1 and the first metallic thin film 2MI to each other.

<First Manufacturing Method>

Figure 19A:
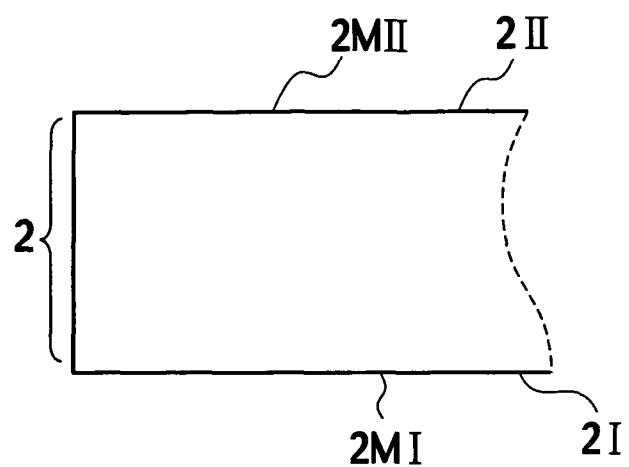
FIG. 19A, FIG. 19B and FIG. 19C are views for explaining a first manufacturing method the semiconductor device under the present invention.
Figure 19B:
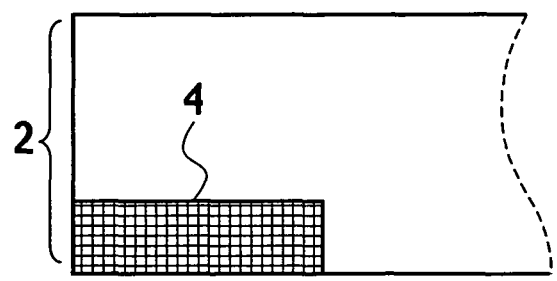
Figure 19C:
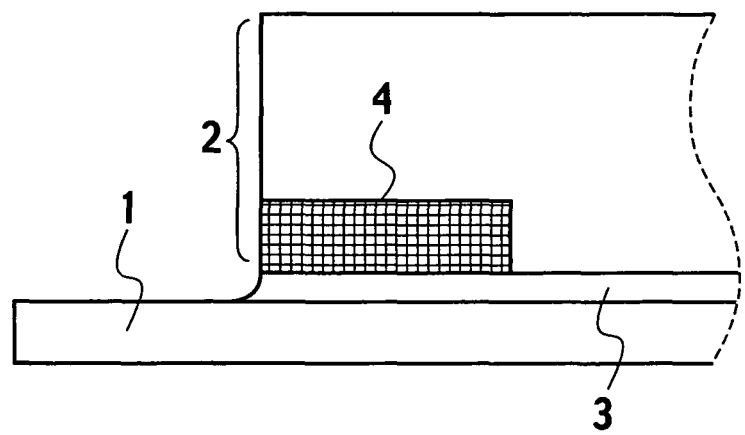

A first method of manufacturing the semiconductor device 100 shown in FIG. 2 is described referring to FIG. 19A, FIG. 19B and FIG. 19C.

The crystalline defect region 4 is formed in a part (certain region) of the semiconductor chip 2 shown in FIG. 19A to thereby realize the state in FIG. 19B. In this case, the crystalline defect region 4 should be formed according to the second forming method including the following operations:

1) forming a shallow groove in a certain portion (cross region 2Ia) of the first main face 2I, 2) depositing, in the shallow groove, a material different from a semiconductor material that is a constituent of the semiconductor chip 2, and 3) flattening the certain portion (cross region 2Ia) where the shallow groove is formed.

Next, after the forming of the first metallic thin film 2MI on the backface 2I of the semiconductor chip 2, the following operations are implemented:

1) placing the adhesive 3 between the backface 2I of the semiconductor chip 2 and the metallic substrate 1, 2) heating all components to equal to or higher than the melting temperature of the adhesive 3, 3) decreasing the temperature back to room temperature, and 4) accomplishing the state of FIG. 19C, in other words, a state where the semiconductor device 100 shown in FIG. 2 is completed.

<Second Manufacturing Method>

Figure 20A:
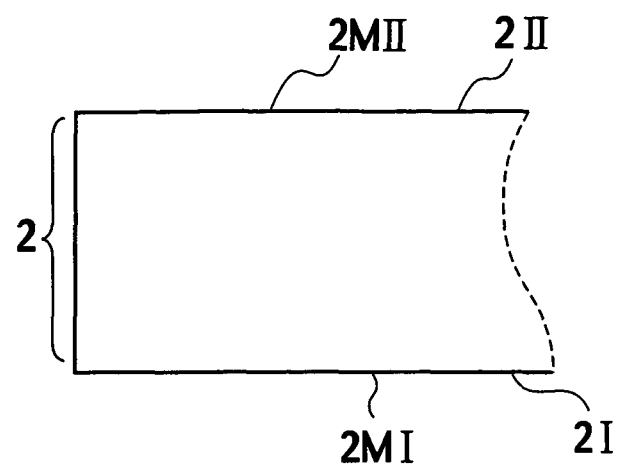
FIG. 20A, FIG. 20B and FIG. 20C are views for explaining a second manufacturing method of the semiconductor device under the present invention.
Figure 20B:
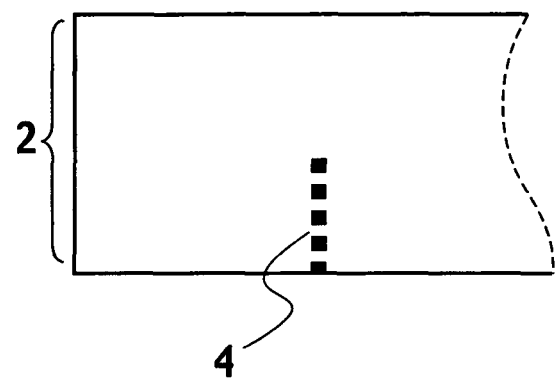
Figure 20C:
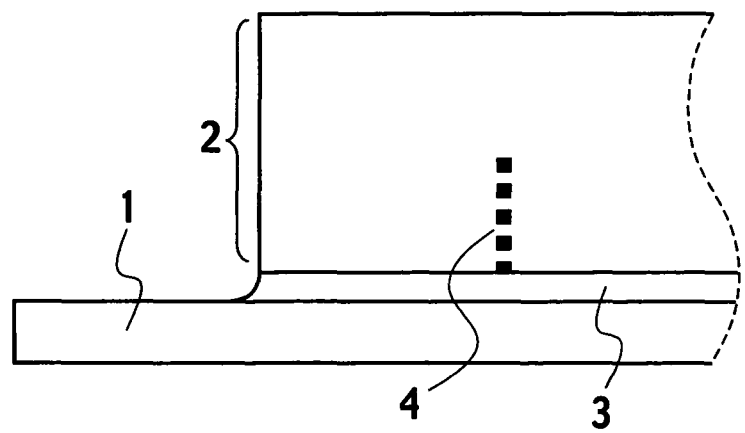

A second method of manufacturing the semiconductor device 100 shown in FIG. 8 is described referring to FIG. 20A, FIG. 20B and FIG. 20C.

The crystalline defect region 4 is formed in a part (certain region) of the semiconductor chip 2 shown in FIG. 20A to thereby realize the state in FIG. 20B. In this case, the crystalline defect region 4 should be formed according to the first forming method including the following operations:

1) focusing, into the semiconductor chip 2, a laser beam having a wavelength to be absorbed by the semiconductor chip 2, 2) instantaneously heating the dot-like regions, and 3) instantaneously quenching the dot-like regions.

Next, after the forming of the first metallic thin film 2MI on the backface 2I of the semiconductor chip 2, the following operations are implemented:

1) placing the adhesive 3 between the backface 2I of the semiconductor chip 2 and the metallic substrate 1, 2) heating all components to equal to or higher than the melting temperature of the adhesive 3, 3) decreasing the temperature back to room temperature, and 4) accomplishing the state of FIG. 20C, in other words, a state where the semiconductor device 100 shown in FIG. 8 is completed.

<Third Manufacturing Method>

Figure 21A:
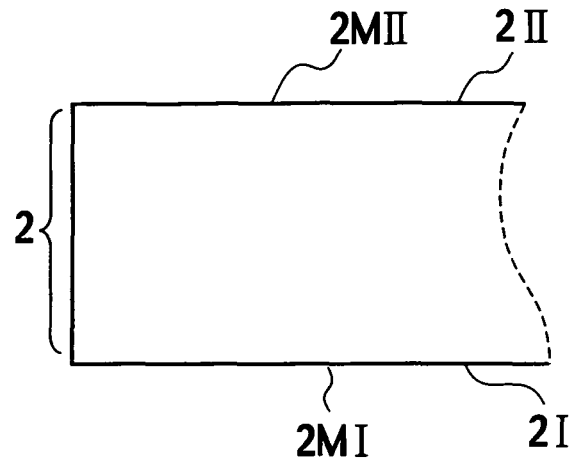
FIG. 21A, FIG. 21B and FIG. 21C are views for explaining a third manufacturing method of the semiconductor device under the present invention.
Figure 21B:
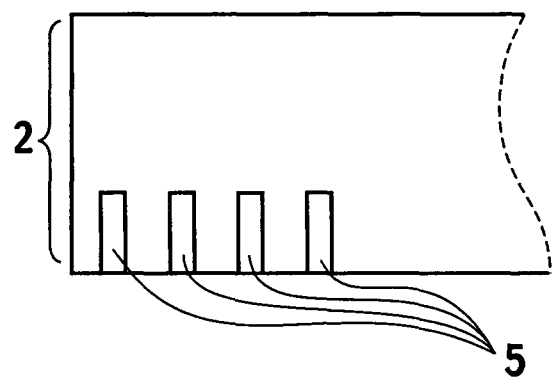
Figure 21C:
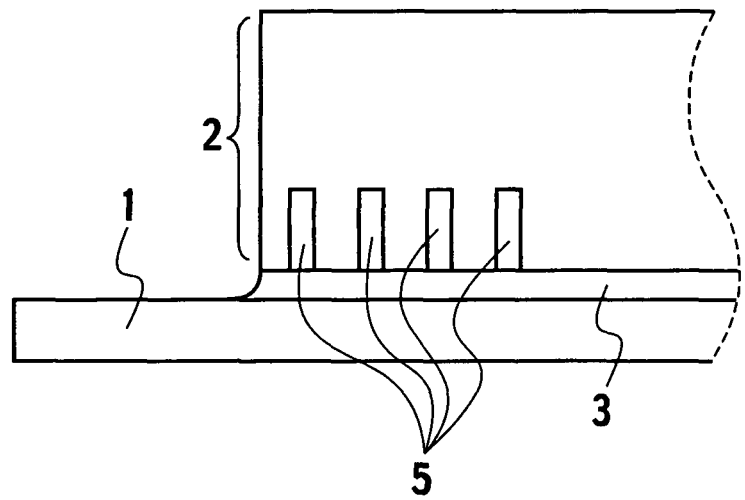

A third method of manufacturing the semiconductor device 100 shown in FIG. 16 is described referring to FIG. 21A, FIG. 21B and FIG. 21C.

The crystalline defect region 4 is formed in a part (certain region) of the semiconductor chip 2 shown in FIG. 21A to thereby realize the state in FIG. 21B. In this case, the crystalline defect region should be formed according to the third method including the following operation:

1) forming the groove 5 in the first main face 2I of the semiconductor chip 2, such that the depth 5D of the groove 5 is equal to or larger than the width 5W of the groove 5.

Next, after the forming of the first metallic thin film 2MI on the backface 2I of the semiconductor chip 2, the following operations are implemented:

1) placing the adhesive 3 between the backface 2I of the semiconductor chip 2 and the metallic substrate 1, 2) heating all components to equal to or higher than the melting temperature of the adhesive 3, 3) decreasing the temperature back to room temperature, and 4) accomplishing the state of FIG. 21C, in other words, a state where the semiconductor device 100 shown in FIG. 16 is completed.

Although the present invention has been described above by reference to certain embodiments, the present invention is not limited to the embodiments described above. Modifications and variations of the embodiments described above will occur to those skilled in the art, in light of the above teachings.

This application is based on a prior Japanese Patent Application Nos. P2007-058505 (filed on Mar. 8, 2007 in Japan) and P2007-278693 (filed on Oct. 26, 2007 in Japan). The entire contents of the Japanese Patent Application Nos. P2007-058505 and P2007-278693 from which priorities are claimed are incorporated herein by reference, in order to take some protection against translation errors or omitted portions.

The scope of the present invention is defined with reference to the following claims.

What is claimed is:

1. A semiconductor device comprising:
a semiconductor chip including:
a first main face having an edge portion,
a second main face located opposite to the first main face,
a crystalline defect region present within a region of the edge portion and adjacent to the first main face, the crystalline defect region being structured to have a first stress for a strain, and
an other semiconductor region present in a region other than the region of the edge portion within which the crystalline defect region is present, the other semiconductor region being structured to have a second stress for the strain, the first stress being lower than the second stress; and
a metallic substrate to be bonded via a bonding member to the first main face of the semiconductor chip.

2. The semiconductor device according to claim 1, wherein the crystalline defect region is a region or an aggregation of regions including more crystalline defects than the other semiconductor region.

3. The semiconductor device according to claim 1, wherein the crystalline defect region has a certain volume defined as a pillar-like region having:
a bottom area being defined by an edge of a first side and an edge of a second side of its periphery, and the bottom area being defined by a line in the first main face connecting the first and second side edges; and
a height of the pillar of which height being not larger than a thickness of the semiconductor chip.

4. The semiconductor device according to claim 3, wherein the connecting line has a circular arc tangent to the first side at a first point and the second side at a second point.

5. The semiconductor device according to claim 3, wherein the connecting line is a straight line for connecting the first side at a first point and the second side at a second point.

6. The semiconductor device according to claim 3, wherein the connecting line is a plurality of straight lines each of which is a part of a polygon.

7. The semiconductor device according to claim 3, wherein a plurality of the crystalline defect regions are formed to be reached to the first main face and to be along the connecting line perpendicularly to the first main face.

8. The semiconductor device according to claim 1, wherein the crystalline defect region includes at least one groove formed in the first main face of the semiconductor chip, and a depth of the groove is equal to or larger than a width of the groove.

9. The semiconductor device according to claim 8, wherein the depth of the groove is equal to or larger than twice an interval between ends of the groove.

10. The semiconductor device according to claim 1, wherein the crystalline defect region is formed inside the semiconductor chip away from side faces of the semiconductor chip, by a certain distance, and each side face shares an edge line with the first main face.

11. The semiconductor device according to claim 10, wherein the certain distance is approximately 10 μm.

12. The semiconductor device according to claim 1, wherein the crystalline defect region is formed in a substantially planar shape in parallel with the first main face.

13. The semiconductor device according to claim 1, wherein:
the crystalline defect region is configured to be formed by the following operations:

focusing, into the semiconductor chip, a laser beam having a wavelength to be absorbed by the semiconductor chip, heating a dot-like region within a region including the edge portion of the first main face, and quenching the dot-like region.

14. The semiconductor device according to claim 1, wherein:

the crystalline defect region is configured to be formed by the following operations:

forming a groove in a certain portion of the first main face, depositing, in the groove, a material different from a semiconductor material which is a constituent of the semiconductor chip, and flattening the certain portion of the first main face.

15. The semiconductor device according to claim 14, wherein the certain portion of the first main face is a cross region on a backface of a wafer.

16. A method of manufacturing the semiconductor device according to claim 1, the method comprising:

forming the crystalline defect region in a certain region of the semiconductor chip;

forming a first metallic thin film on the first main face of the semiconductor chip which is in a state of being bonded to the metallic substrate; and bonding the metallic substrate to the first metallic thin film via the bonding member which is an adhesive.

17. The method of manufacturing the semiconductor device according to claim 16, further comprising the following operations for forming the crystalline defect region:

focusing, into the semiconductor chip, a laser beam having a wavelength to be absorbed by the semiconductor chip, heating a dot-like region within a region including the edge portion of the first main face, and quenching the dot-like region.

18. The method of manufacturing the semiconductor device according to claim 16, further comprising the following operations for forming the crystalline defect region:

forming a groove in a certain portion of the first main face, depositing in the groove a material different from a semiconductor material which is a constituent of the semiconductor chip, and flattening the certain portion of the first main face.

19. The method of manufacturing the semiconductor device according to claim 16, further comprising the following operation for forming the crystalline defect region:

forming a groove in the first main face of the semiconductor chip, such that a depth of the groove is equal to or larger than a width of the groove.

20. The method of manufacturing the semiconductor device according to claim 19, wherein the depth of the groove is equal to or larger than twice an interval between ends of the groove.

21. The semiconductor device according to claim 1, wherein the same strain is applied to the crystalline defect region and the other semiconductor region at the same time.

22. The semiconductor device according to claim 1, wherein the crystalline defect region is a region including more crystalline defects than the other semiconductor region.

* * * * *